(12) United States Patent
Kim et al.

(10) Patent No.: US 6,392,921 B1
(45) Date of Patent: May 21, 2002

(54) DRIVING CIRCUIT FOR NON DESTRUCTIVE NON VOLATILE FERROELECTRIC RANDOM ACCESS MEMORY

(75) Inventors: Yong Tae Kim; Chun Keun Kim; Seong Il Kim; Sun Il Shim, all of Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 0 days.

(21) Appl. No.: 09/900,184

(22) Filed: Jul. 9, 2001

(30) Foreign Application Priority Data

Aug. 1, 2000 (KR) .......................... 2000/44606

(51) Int. Cl.$^7$ .............................................. G11C 11/00
(52) U.S. Cl. ........................................ 365/145; 365/149
(58) Field of Search ................................. 365/145, 149

(56) References Cited

U.S. PATENT DOCUMENTS 5,812,442 A * 9/1998 Yoo ............................ 365/145
6,046,927 A * 4/2000 Lee et al. ..................... 365/145
6,242,771 B1 * 6/2001 Hsu et al. ..................... 365/145

* cited by examiner

*Primary Examiner*—Trong Phan
(74) *Attorney, Agent, or Firm*—Birch, Stewart, Kolasch & Birch, LLP

(57) ABSTRACT

The driving circuit for an NDRO-FRAM includes several NDRO-FRAM (Non Destructive Non Volatile Ferroelectric Random Access Memory) cells each having a drain, a bulk, a source and a gate and arranged as a matrix. A plurality of reading word lines are separately connected to each drain of the NDRO-FRAM cells arranged in columns, and a plurality of writing word lines are separately connected to each bulk of the NDRO-FRM cells arranged in columns. Several data level transmission circuits for transmitting a data level of the NDRO-FRAM cells are also included, which are connected to a plurality of data level transmission circuits. Accordingly, the present invention is capable of reading and writing of data on the NDRO-FRAM cells.

6 Claims, 5 Drawing Sheets

DRIVING CIRCUIT FOR NON DESTRUCTIVE NON VOLATILE FERROELECTRIC RANDOM ACCESS MEMORY

BACKGROUND OF THE INVENTION

1. Field of the Invention

The present invention relates to a driving circuit for a non destructive non volatile ferroelectric random access memory (hereinafter, it is referred to a NDRO-FRAM), in particular to a driving circuit for a NDRO-FRAM which is capable of reading and writing on the NDRO-FRAM by comprising a word line decoder and a writing driver.

2. Description of the Prior Art

FIG. 1 illustrates a driving circuit for a memory in accordance with the conventional technology. It comprises a pre-charge circuit 1, a equalization circuit 2, memory cells 3a~3n, word lines 4a~4n, a transmission gate 5, a sense amp 6, a data output circuit 7, bit lines 8a, 8b, and data bus lines 9a, 9b.

DRAMs separately constructed with a metal-silicon oxide film-silicon field effect transistor and a metal-oxide film-a metal structure capacitor are used as the memory cells 3a~3n, a column address decoding signal and a row address decoding signal (not shown in FIG. 1) are used in a structure arranged with the columns in order to write or read data on the one memory cell among the memory cells 3a~3n. For example, in the memory cell reading operation, a certain memory cell is selected by selecting the word line inputted the column address decoding signal and the bit lines 8a, 8b inputted the row address decoding signal, the equalization circuit 2 equalizes the bit lines 8a, 8b, the transmission gate 5 receives data level of the certain memory cell displayed on the bit lines 8a, 8b and transmits it to the sense amp 6. The sense amp 6 detects the received data level, amplifies it, and transmits it to the data output circuit 7 through the data bus lines 9a, 9b. The data output circuit 7 transmits the received data level to an external unit.

In the memory cell writing operation, a data input circuit (not shown in FIG. 1) is comprised on the behalf of the data output circuit 7.

In general, the driving circuit of the memory performs the writing operation or reading operation by turning the transistor inside of the memory cell on by the one column address decoding and one row address decoding signal.

FIG. 2 illustrates signs illustrating a NDRO-FRAM cell of a 1 transistor type to be driven according to the embodiment of the present invention, it comprises a drain D, a gate G, a bulk B, and a source S. The driving condition of the NDRO-FRAM cell 2 will now be described in Table 1.

In the writing operation condition of the NDRO-FRAM cell 2, both the drain and bulk are grounded, when 0 is written, −Vcc has to be applied to the gate, when 1 is written, +Vcc has to be applied to the gate in order to polarize polarized dipole existed on the ferroelectrics gate of the NDRO-FRAM cell 2 in accordance with polarity of +voltage or −voltage.

After writing data of 0 or 1 on the gate one time, there is no need to apply the gate voltage again, the NDRO-FRAM cell 2 continually stores the data of 0 or 1. In the reading operation condition of the NDRO-FRAM cell 2, +Vcc is applied to the drain, the source is grounded, the bulk and gate are floated.

When 1 is written on the NDRO-FRAM cell 2, the polarized dipole of the ferroelectrics gate formed already generates the effect same with a case applying the +voltage to the gate channel, according to this, the gate channel is ON and electric current is applied to the drain, accordingly the 1 data level can be read by detecting the electric current.

When 0 is written on the NDRO-FRAM cell 2, the direction of the polarized dipole is reversed, it is as same as applying −voltage to the gate channel, the gate channel is OFF and the drain electric current can not flow, accordingly 0 data level is written.

As described above, differentiating from the conventional DRAM, the NDRO-FRAM cell having 1 transistor type has to apply the signal to the drain, gate, source, bulk in the reading and writing operation, accordingly the conventional driving circuit of FIG. 1 can not perform the above-described operation.

SUMMARY OF THE INVENTION

In order to solve the above-mentioned problems, the object of the present invention is to provide a driving circuit which is capable of performing reading operation and writing operation on a non destructive non volatile ferroelectric random memory.

[TABLE 1]

|  | DRAIN (D) | BULK (B) | SOURCE (S) | GATE (G) |
| --- | --- | --- | --- | --- |
| READING OPERATION | +Vcc | FLOATING | GROUNDING | FLOATING |
| WRITING OPERATION | GROUNDING | GROUNDING | FLOATING | WHEN 1 IS WRITTEN (+Vcc) WHEN 0 IS WRITTEN (−Vcc) |

DETAILED DESCRIPTION OF THE PREFERRED EMBODIMENT

In order to achieve the above-mentioned objects, a driving circuit of a non destructive non volatile ferroelectric random access memory (hereinafter, it is referred to NDRO-FRAM) according to the present invention comprises a plurality of NDRO-FRAM (Non Destructive Non Volatile Ferroelectric Random Access Memory) cells separately having a drain, a bulk, a source and a gate and arranged as a matrix, a plurality of reading word lines separately connected to the each drain of the NDRO-FRAM cells arranged in columns, a plurality of writing word lines separately connected to the each bulk of the NDRO-FRM cells arranged in columns, a plurality of reading bit lines separately connected to the each source of the NDRO-FRAM cells arranged in rows, a plurality of writing bit lines separately connected to the each gate of the NDRO-FRAM cells arranged in rows, a plurality of word line decoders for generating and transmitting separately a reading word signal and a writing word signal by connecting to the one reading word line and one writing word line connected to the NDRO-FRAM cell in the same column, a plurality of data level transmission circuits for transmitting data level of the NDRO-FRAM cell by connecting to the one reading bit line, a sense amp for detecting the data level of the NDRO-FRAM cell by connecting to the plurality of data level transmission circuits, and a writing driver for generating and transmitting a writing bit signal by connecting to the plurality of the writing bit lines.

Figure 1:
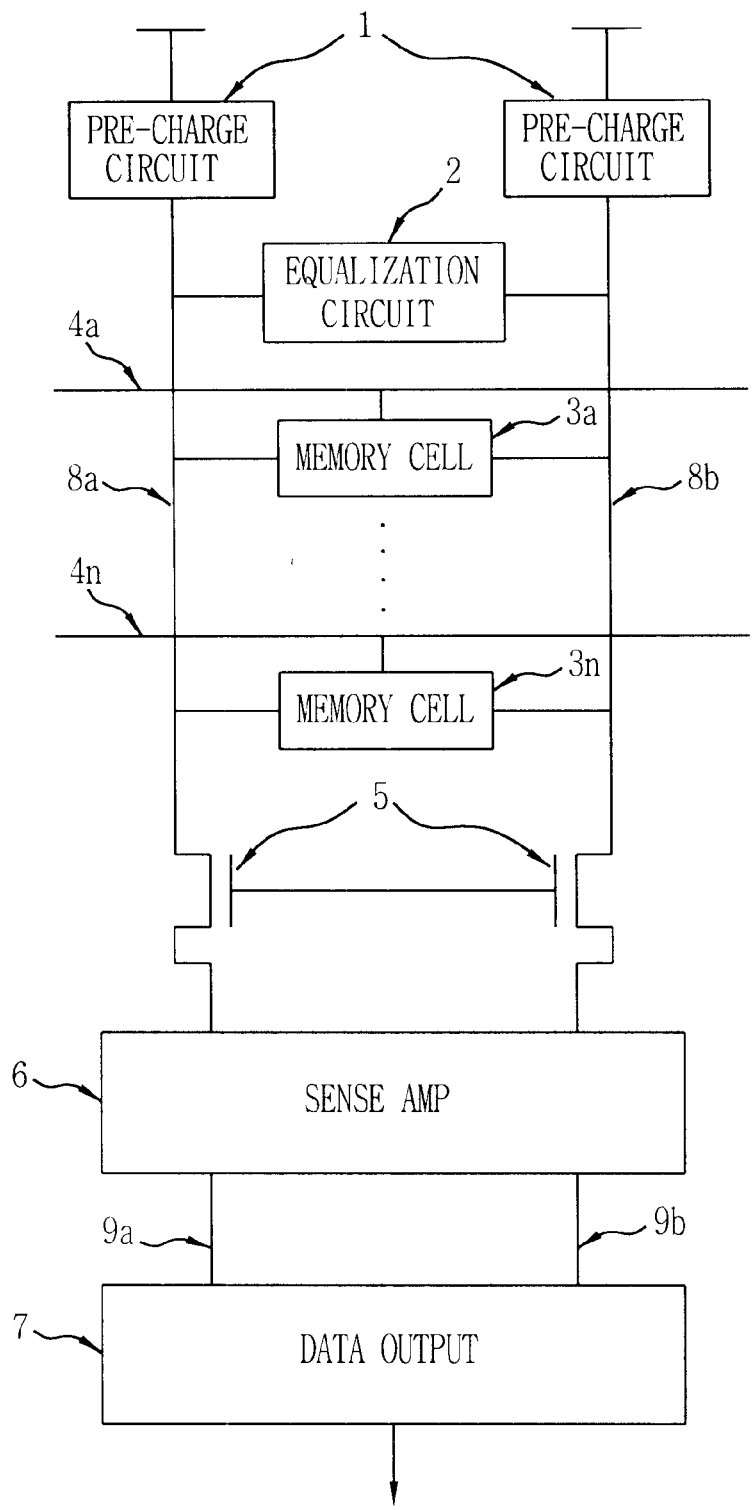
FIG. 1 is a construction profile illustrating a driving circuit of a memory according to the conventional technology.
Figure 2:
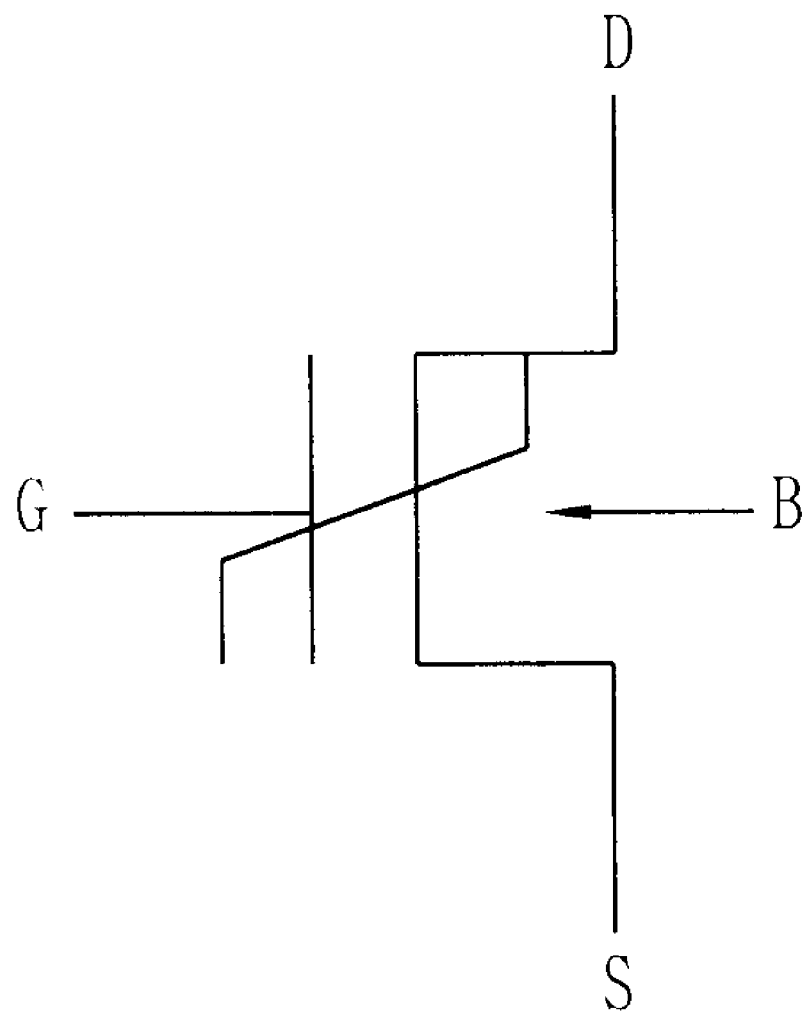
FIG. 2 illustrates signs of a 1 transistor type NDRO-FRAM to be driven according to the embodiment of the present invention.
Figure 3:
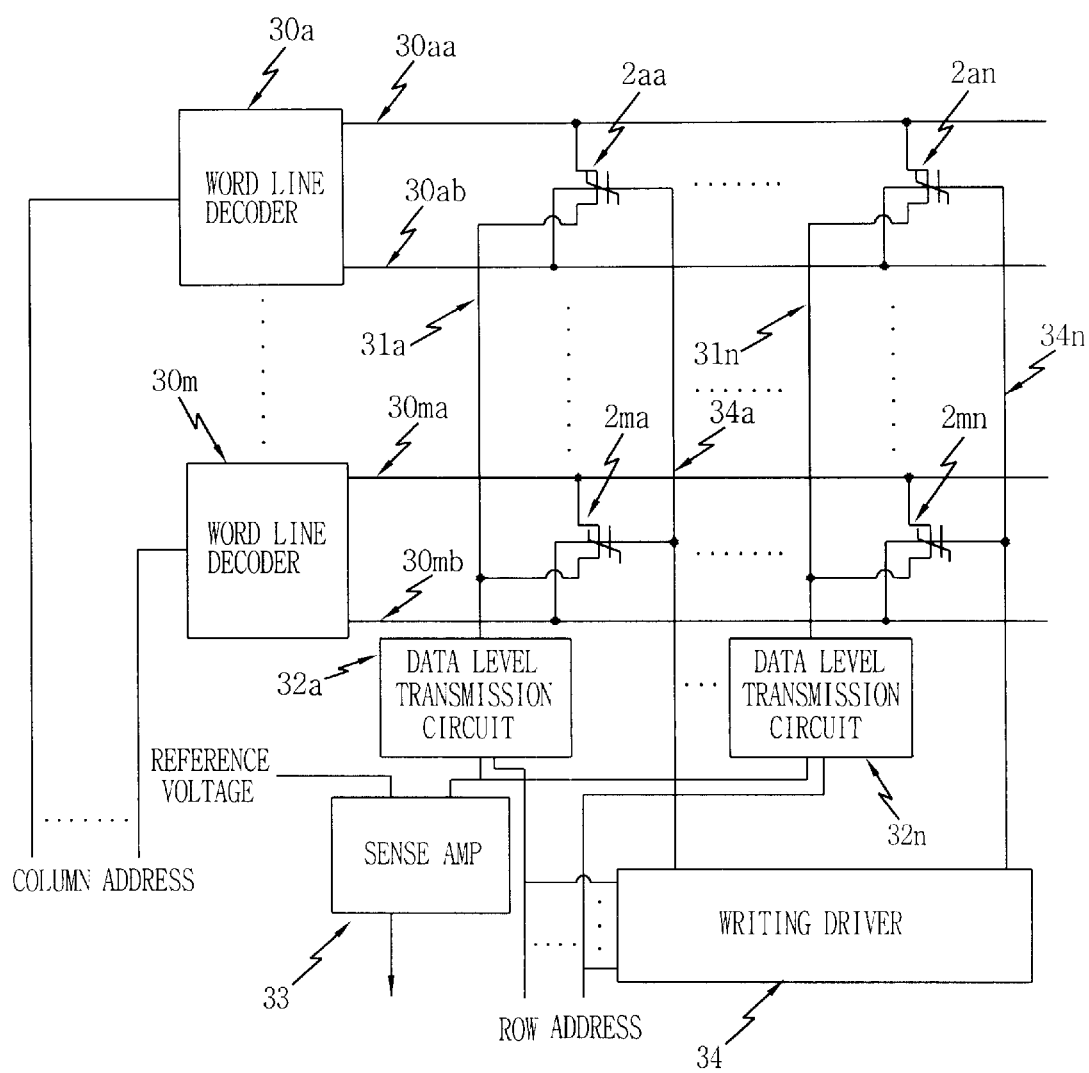
FIG. 3 is a construction profile illustrating the NDRO-FRAM driving circuit of FIG. 2.

FIG. 3 is a construction profile illustrating the NDRO-FRAM driving circuit of FIG. 2. It comprises a plurality of NDRO-FRAM cells 2aa~2mn having a drain, a bulk, a source and a gate and arranged as a matrix, a plurality of reading word lines 30aa~30ma connected to the drain of the NDRO-FRAM cell arranged in columns, a plurality of writing word lines 30ab~30mb connected to the bulk of the NDRO-FRM cell arranged in columns, a plurality of reading bit lines 31a~31n connected to the source of the NDRO-FRAM cell arranged in rows, a plurality of writing bit lines 34a~34n connected to the gate of the NDRO-FRAM cell arranged in rows, a plurality of word line decoders 30a~30m connected to the one reading word line and one writing word line of the NDRO-FRAM cell in the same column in order to generate separately a reading word signal and a writing word signal and transmit them, a plurality of data level transmission circuits 32a~32n separately connected to the reading bit lines 31a~31n in order to transmit data level of the NDRO-FRAM cells 2aa~2mn, a sense amp 33 connected to the plurality of data level transmission circuits 32a~32n in order to detect the data level of the NDRO-FRAM cells 2aa~2mn, and a writing driver 34 connected to the plurality of writing bit lines 34a~34n in order to generate and transmit a writing bit signal.

When the driving circuit operates, among the word line decoders 30a~30m, the one word line decoder being inputted a column address decoding signal applies a power supply voltage signal +Vcc to the drain of the column NDRO-FRAM cell through the reading word line connected to the word line decoder, and applies a floating signal to the bulk of the column NDRO-FRAM cell through the writing word line. In addition, the writing driver 34 being inputted the row address decoding signal from the outside applies the floating signal to the gate of the NDRO-FRAM cells 2aa~2mn through the writing bit lines 34a~34n. Among the data level transmission circuits 32a~32n, the one data level transmission circuit being inputted the row address decoding signal is ON as soon as receiving the signal and transmits the data level of a certain NDRO-FRAM cell selected by the column address decoding signal and row address decoding signal to the sense amp 33 through the reading bit line, and the rest of the data level transmission circuits are OFF.

Whenever the row address decoding signal is inputted, the data level transmission circuits 32a~32n set the reading bit lines 31a~31n as a low level, transmit a signal lower than the reference voltage inputted from the external to the sense amp 34.

When 1 is written on the selected NDRO-FRAM cell, the power providing voltage +Vcc level of the drain of the cell is transmitted to the sense amp 34 through the reading bit line by the ON state of the selected NDRO-FRAM cell, the voltage level is a signal higher than the reference voltage.

When 0 is written, the power providing voltage level –Vcc of the drain of the cell is transmitted to the sense amp 34 through the reading bit line, the voltage level is a signal lower than the reference voltage. The sense amp 34 detects and amplifies the reference voltage and transmitted data level, and generates an output signal.

In the writing operation of the driving circuit, among the word line decoders 30a~30m, the one word line decoder inputted the column address decoding signal from the external grounds the drain of the column NDRO-FRAM cell through the reading word line connected to the word line decoder, and grounds the bulk of the column NDRO-FRAM cell through the writing word line. In addition, the writing driver 34 inputted the row address decoding signal from the outside applies a writing bit signal meaning a data level to be stored on the gate of the row NDRO-FRAM cell through the one of the writing bit lines 34a~34n, and applies a floating signal to the rest of the writing bit lines in accordance with the row address decoding signal.

When the data level to be stored on the NDRO-FRAM cell is 1, the power providing voltage +Vcc signal is applied to the gate of the row NDRO-FRAM cell, when the data level to be stored on the NDRO-FRAM cell is 0, the power providing voltage –Vcc signal is applied. In the writing operation, the data level transmission circuits 32a~32n are all OFF.

Figure 4A:
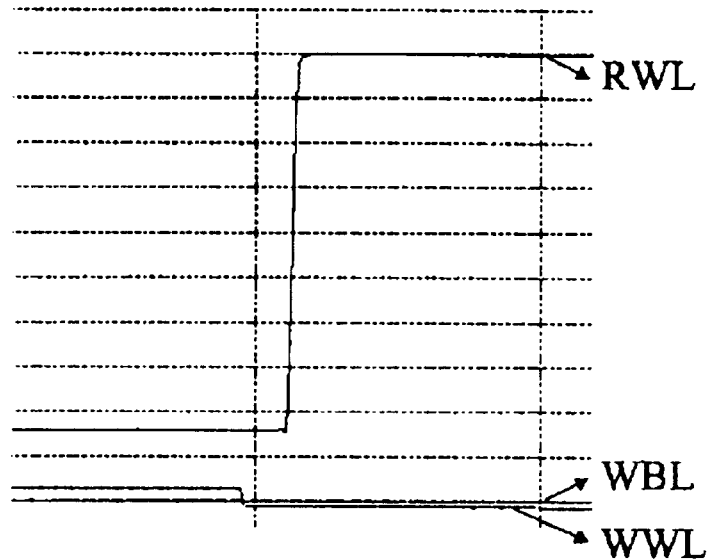
FIG. 4a is a signal graph of the driving circuit of FIG. 3 in the reading operation.
Figure 4B:
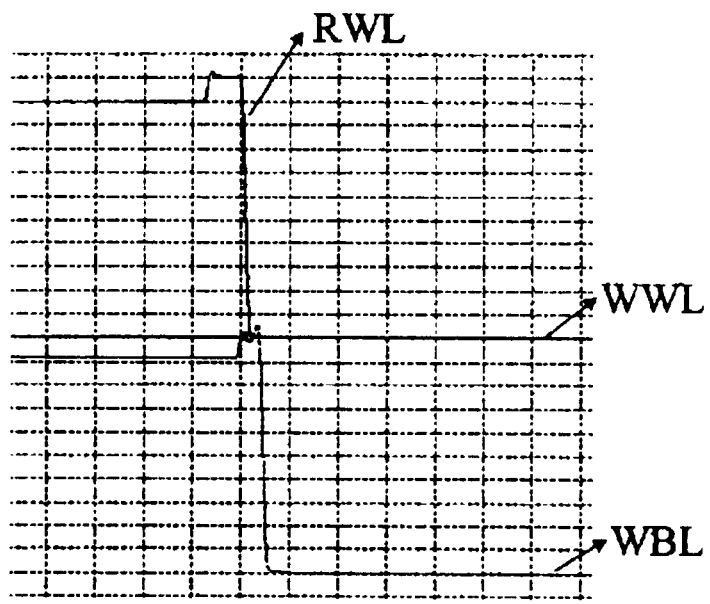
FIG. 4b is a signal graph illustrating the 0 writing operation of the driving circuit of FIG. 3.
Figure 4C:
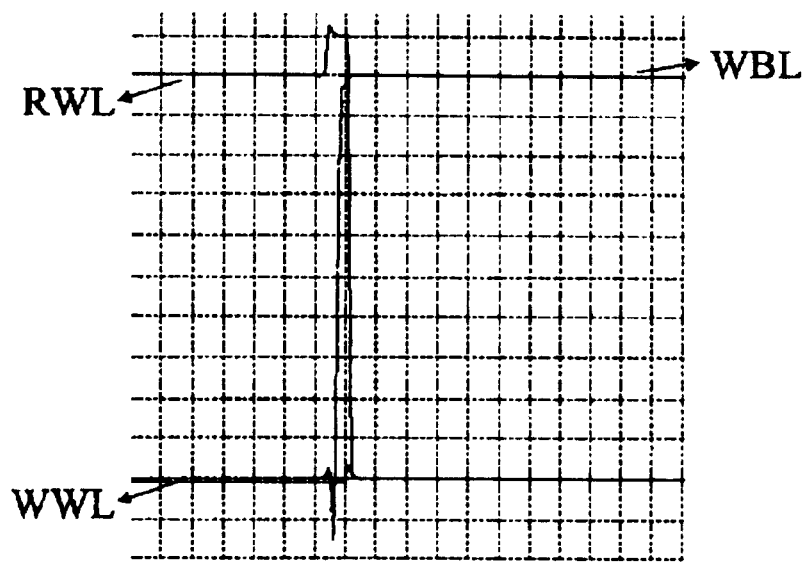
FIG. 4c is a signal graph illustrating the 1 writing operation of the driving circuit of FIG. 3.

FIG. 4a~4c illustrate a reading word signal RWL, a writing word signal WWL, and a writing bit signal WBL applied to the driving circuit of FIG. 3. Herein, X axis means time ns, and Y axis means voltage Volt.

FIG. 4a is a graph illustrating the reading operation of the driving circuit of FIG. 3, herein the reading word signal RWL is the power providing voltage +Vcc, the writing word signal WWL and writing bit signal WBL are the floating signals.

FIG. 4b is a graph illustrating the 0 writing operation of the driving circuit of FIG. 3, herein the reading word signal RWL and writing word signal WWL are grounded, the writing bit signal WBL is the power providing voltage –Vcc.

FIG. 4c is a graph illustrating the 1 writing operation of the driving circuit of FIG. 3, herein the reading word signal RWL and writing word signal WWL are grounded, the writing bit signal WBL is the power providing voltage +Vcc.

The driving circuit in accordance with the present invention can read data on the 1 transistor type NDRO-FRAM cell or can write data on the 1 transistor type NDRO-FRAM cell. In addition, the driving circuit in accordance with the present invention can accelerate commercialization of the non destructive non volatile ferroelectric random access memory.

What is claimed is:

1. A driving circuit for a non destructive non volatile ferroelectric random access memory, comprising:

a plurality of NDRO-FRAM (Non Destructive Non Volatile Ferroelectric Random Access Memory) cells separately having a drain, a bulk, a source and a gate and arranged as a matrix;

a plurality of reading word lines separately connected to the each drain of the NDRO-FRAM cells arranged in columns;

a plurality of writing word lines separately connected to the each bulk of the NDRO-FRM cells arranged in columns;

a plurality of reading bit lines separately connected to the each source of the NDRO-FRAM cells arranged in rows;

a plurality of writing bit lines separately connected to the each gate of the NDRO-FRAM cells arranged in rows;

a plurality of word line decoders for generating and transmitting separately a reading word signal and a writing word signal by connecting to the one reading word line and one writing word line connected to the NDRO-FRAM cell in the same column;

a plurality of data level transmission circuits for transmitting data level of the NDRO-FRAM cell by connecting to the one reading bit line;

a sense amp for detecting the data level of the NDRO-FRAM cell by connecting to the plurality of data level transmission circuits; and a writing driver for generating and transmitting a writing bit signal by connecting to the plurality of the writing bit lines.

2. The driving circuit for the NDRO-FRAM according to claim 1, wherein the word line decoder generates and transmits the reading word signal and writing word signal by being inputted a column address decoding signal, the writing driver generates and transmits the writing bit signal on a writing bit line selected in accordance with a row address decoding signal by being inputted the row address decoding signal, and the data level transmission circuit reads the data level of the NDRO-FRAM cell by being inputted the row address decoding signal and transmitting the data level of the NDRO-FRAM cell receiving the reading word signal, writing word signal, writing bit signal to the sense amp.

3. The driving circuit for the NDRO-FRAM according to claim 2, wherein the reading bit line is set as a low level at the each row address decoding signal, when the data level of the NDRO-FRAM cell is 0 by being inputted a reference signal, the sense amp reads the data level of the NDRO-FRAM cell by being inputted a signal lower than the reference signal from the reading bit line and outputting it, when the data level of the NDRO-FRAM cell is 1, the sense amp reads the data level of the NDRO-FRAM cell by being inputted a signal higher than the reference signal from the reading bit line and outputting it.

4. The driving circuit for the NDRO-FRAM according to claim 2, wherein the reading word signal is a power providing voltage signal, the writing word signal is a floating signal, and the writing bit signal is a floating signal.

5. The driving circuit for the NDRO-FRAM according to claim 1, wherein the word line decoder generates and transmits the reading word signal and writing word signal by being inputted the column address decoding signal, the data level transmission circuit is OFF in order to ground the reading bit line, and the writing driver generates and transmits the writing bit signal on the writing bit line by being inputted the row address decoding signal in order to record on the NDRO-FRAM cell.

6. The driving circuit for the NDRO-FRAM according to claim 5, wherein the reading word signal is a grounding signal, the writing word signal is a grounding signal, the writing bit signal is data to be recorded on the NDRO-FRAM cell selected in accordance with the row address decoding signal, and the floating signal is a signal to be recorded on the NDRO-FRAM cell unselected in accordance with the row address decoding signal.

* * * * *